United States Patent [19]

Beck et al.

[11] 4,203,137
[45] May 13, 1980

[54] DUAL MODE READ PREAMPLIFIER WITH ELECTRICAL SHORT DETECTOR

[75] Inventors: John W. Beck, Santa Cruz; Donald P. McCown, Morgan Hill, both of Calif.

[73] Assignee: International Business Machines Corporation, Armonk, N.Y.

[21] Appl. No.: 934,443

[22] Filed: Aug. 17, 1978

[51] Int. Cl.$^2$ .......................... G11B 27/36; G11B 5/09
[52] U.S. Cl. .......................................... 360/31; 360/53
[58] Field of Search .................. 360/53, 31, 67, 61

[56] References Cited

U.S. PATENT DOCUMENTS

| | | | |
|---|---|---|---|
| 3,479,650 | 11/1969 | Montgomery | 360/53 |
| 3,707,707 | 12/1972 | Spencer et al. | 360/53 |
| 3,810,236 | 5/1974 | Horowitz et al. | 360/53 |

Primary Examiner—Vincent P. Canney
Attorney, Agent, or Firm—Nathan N. Kallman

[57] ABSTRACT

Monitoring the performance of recording channels during the write mode is accomplished by available read preamplifier circuitry, and a write monitor channel. During the read mode, the read preamplifier functions conventionally. During the write mode, the write signal is attenuated and monitored. The monitor circuit senses failures in the write operation and can detect the absence of write current transitions. Isolation between the non-selected channels and the selected channel is effectively provided. A detection circuit is coupled to the preamplifier for detecting electrical shorts in the magnetic heads and wiring.

9 Claims, 8 Drawing Figures

DUAL MODE READ PREAMPLIFIER WITH ELECTRICAL SHORT DETECTOR

DESCRIPTION

Technical Field

This invention relates to monitoring the performance of recording channels and electrical components therein.

An object of this invention is to provide a monitor for testing write channels by use of available read circuitry.

Another object of this invention is to provide a circuit for sensing electrical shorts in magnetic heads.

BACKGROUND ART

In prior art storage systems, write channel circuitry operation including the magnetic heads were monitored by providing additional test circuits across the heads to determine whether the write channel was operating satisfactorily. The additional electronics would load the head and contribute noise signal so that monitoring was subject to error.

When more than one recording channel is employed in a system, and each channel has its own test circuits coupled across the magnetic heads, the probability of error increases as well as the cost and maintenance of the additional test circuits. Further problems arise when thin film heads are used as the read/write elements. In such event, the inductance of the wire leads attached to the thin film is greater than the relatively low inductance of the thin film head itself. Thus, inductive measurements for checking operability of the multiplicity of thin film heads that may be used in data storage systems do not provide accurate testing results. Apparently, it would be desirable to provide accurate means for checking operability of write channels and magnetic heads of the thin film type in a simplified and inexpensive way.

BRIEF DESCRIPTION OF THE DRAWING

The invention will be described in detail with reference to the drawing in which.

DISCLOSURE OF THE INVENTION

Figure 1:
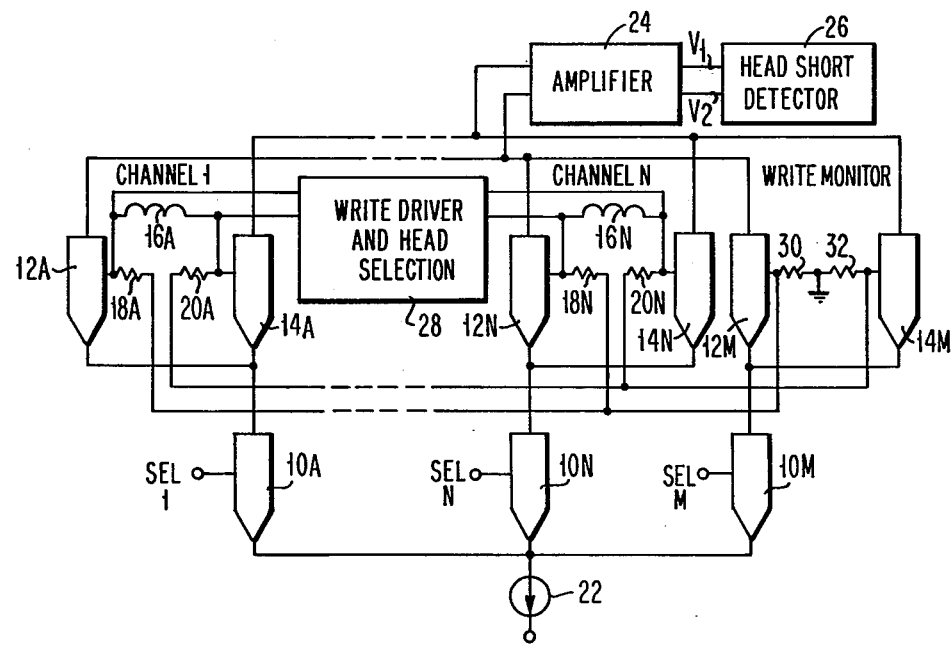
FIG. 1 is a block and schematic diagram illustrating the test circuit used for testing the write channels and magnetic heads, according to this invention.

With reference to FIG. 1, a dual mode preamplifier, according to the invention, includes a series of recording channels 1 through N and a monitor channel M forming part of a data recording and readout system. Only circuit elements of channels 1 and N and the write monitor channel M are shown, the other channels being between 1 and N which are similarly constructed not being shown for convenience and simplicity of explanation.

During the read mode, the read preamplifier operates conventionally and substantially in the same manner as in the prior art. In operation, one of the data channels 1 through N is selected for activation by the application of a select signal to the base of one of the gate transistors 10A–10N. For the purpose of explanation, channel 1 containing elements identified as the A group will be selected and described as exemplary of the other data channels 2 through N. The selected transistor 10A, when activated, steers current through a current source 22, and biases the selected channel on while the other channels are biased off. As a result, a selected magnetic head 16A, which may be a thin film head or a non-center-tapped head, associated with the selected data channel 1 is energized for transducing relation with a storage medium, such as a magnetic disk in a well known manner. A balanced differential signal is derived across the head 16A, which is a relatively low level signal of about 0.5 millivolts peak to peak, by way of example. This signal is amplified by gain transistors 12A and 14A, which convert the input voltage across the head to a differential current appearing at the respective collectors of the gain transistors.

The bases of the gain transistors are connected to relatively high resistances 18A and 20A, which may be in the order of 750 ohms, by way of example. The resistors 18A and 20A are coupled to relatively low resistances 30 and 32, which may be about 2 ohms for example, in the monitor stage M. The resistance network provides a 375:1 attenuation, which appears at the input of each of the channels, and which effectively isolates the channels from each other so that there is no transfer of noise signals between the channels.

During the write mode, in accordance with this invention, the write monitor channel M is energized by the application of a select signal to the base of the gate transistor 10M. A write driver and head selection circuit 28 transmits a write signal to the selected data channel and head. The write signal that is applied to the selected magnetic head, say 16A, is processed through the gain transistors 12M and 14M of the write monitor channel. The amplified signal at the collectors of the transistors 12M and 14M is passed through the amplifier 24, that provides a differential voltage signal V1 and V2 which, in turn, is applied to the input of the head short detector 26.

Since the read preamplifier is designed for processing a relatively low voltage read signal, such as 0.5 millivolt, it is necessary to attenuate the relatively high write signal, which may be in the order of 800–1000 millivolts. The circuit configuration disclosed herein provides a high attenuation factor, which is derived from the interconnection of the 750 ohm resistors 18 and 20 in the selected data channel and the 2 ohm resistors 30 and 32 in the monitor channel. In this manner, the relatively high write signal is reduced to a level which can be processed by the dual mode read preamplifier.

Figure 2:
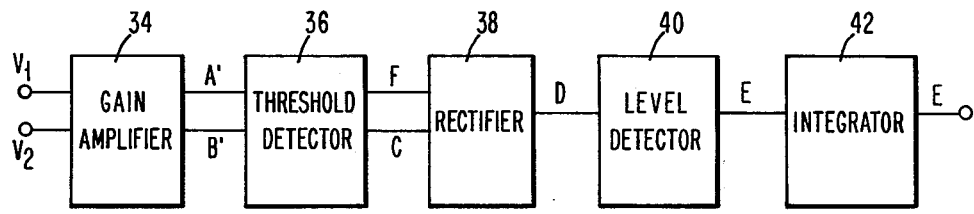
FIG. 2 is a block diagram of the head short detector employed in the network of FIG. 1.
Figure 3:
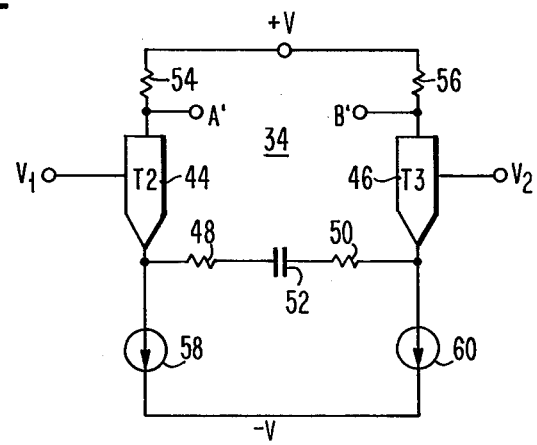
FIG. 3 is a schematic circuit diagram of the gain amplifier employed in the head short detector of FIG. 2.

The head short detector 36 of FIG. 1 is shown in block diagram form in FIG. 2. The gain amplifier 34 receives differential voltage input signals V1 and V2 from the amplifier 24. The gain amplifier 34 isolates the head short detector from the data recording channel, and amplifies the input signal by a factor of 2, by way of example.

Figure 8:
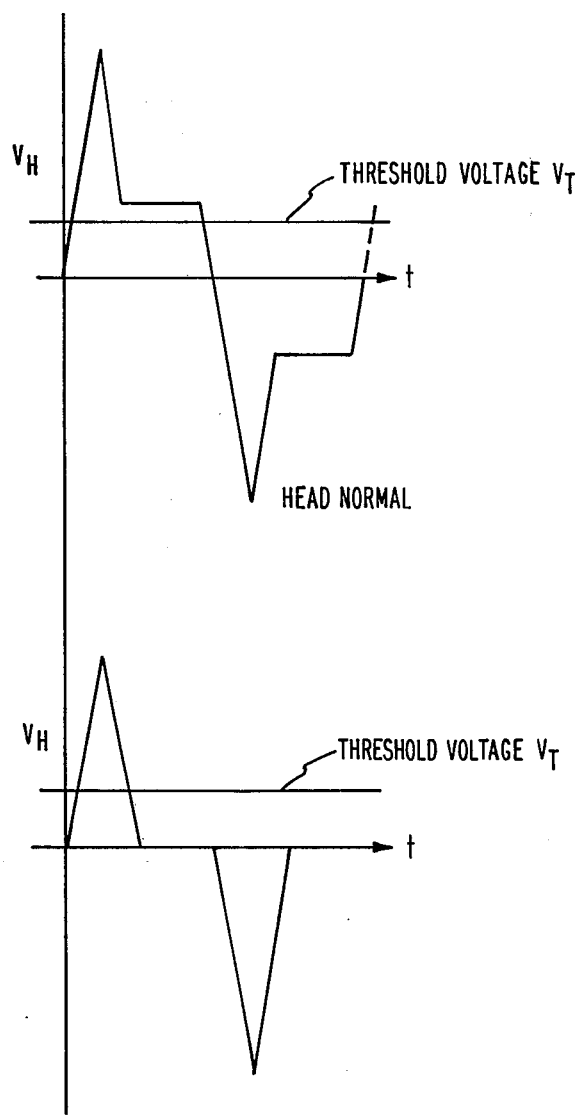
FIG. 8 illustrates two waveforms to aid in the explanation of the invention.

The amplified differential signal A' and B' is fed to a threshold detector 36. The threshold detector 36 determines whether the differential signal A', B' is greater than a specified threshold voltage $V_T$, illustrated in FIG. 8. If the signal appearing at A' or B' is greater than the threshold voltage $V_T$, then the respective voltage outputs F or C will rise. If the signals A' or B' are less than $V_T$, then F and C output signals do not vary. If the signal appearing at A' or B' is greater than the threshold voltage $V_T$ most of the time, the system is writing into a normal operative head. If the signals A' or B' are less than $V_T$ most of the time, this is an indication of a shorted head.

A rectifier 38 rectifies the signals F and C, and whenever either F or C is high, an output signal D from the rectifier appears as high. Signal D remains high most of the time when writing into a normal head.

The level detector 40 senses whether the signal at D is high or low relative to a detecting reference voltage $V_{DET}$, and controls the level of the output signal E. An integrator stage 42 integrates the current supplied by the level detector 40, and provides a clamping function to prevent saturation. The integrated signal $E_I$ provides an indication whether the selected head is functioning normally or if the head is shorted.

The specific circuits are illustrated in FIGS. 3–7. In the detailed circuit of FIG. 3, the gain amplifier 34 includes a symmetrical voltage gain stage including NPN transistors 44 and 46 having their emitters coupled through resistors 48 and 50 of equal value. The collectors of the transistors 44, 46 are coupled through load resistors 54 and 56 of equal value. The differential signal $V_1$ and $V_2$ is applied to the bases of gain transistors 44 and 46, and an amplified differential output signal A', B' is produced. The gain is determined by the ratio of resistor 54 to resistor 48, or similarly resistor 56 to resistor 50. A capacitor 52 connected between resistors 48 and 50 serves to eliminate DC offsets, so that the DC voltage level of the output signals A' and B' is the same. Current sources 58 and 60 tied to a negative voltage supply act to bias the gain stage.

Figure 4:
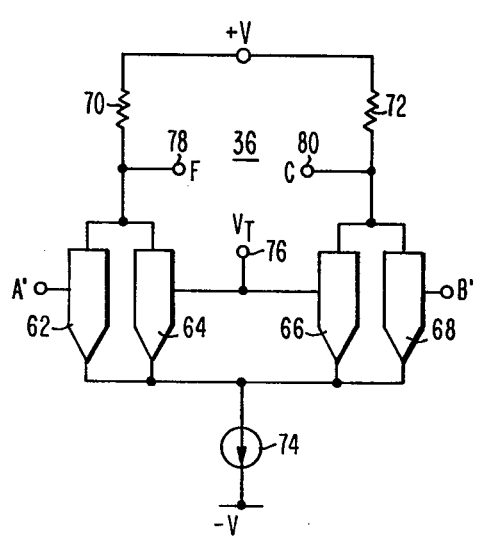
FIG. 4 is a schematic circuit diagram of the threshold detector employed in the head short detector.

In FIG. 4, the differential threshold detector 36 employs emitter coupled NPN transistors 62, 64, 66 and 68. A current source 74 is tied to the emitter circuits of the coupled transistors. A resistor 70 is connected to the collectors of transistors 62 and 64, and a resistor 72 is connected across the collectors of transistors 66 and 68. The resistors 70 and 72 convert the current signal seen at the collector outputs to a voltage signal.

A source of voltage 76 supplies a predetermined threshold voltage $V_T$ or reference voltage at the bases of transistors 64 and 66. The reference voltage $V_T$ is compared to the incoming differential signal A' and B'. If A' and B' is less than the threshold voltage, then there is no signal at the output terminals 78 and 80. However, if A' or B' is greater than the threshold voltage, then a differential signal F and C will appear at the output terminals.

Figure 5:
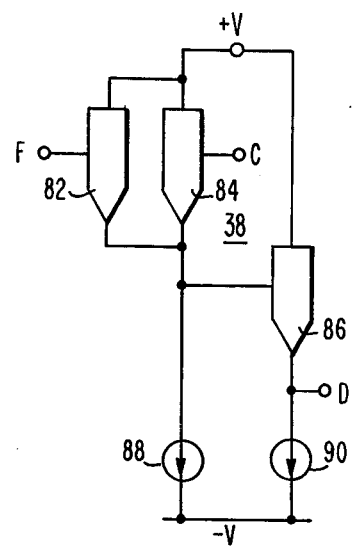
FIG. 5 is a schematic circuit diagram of the rectifier employed in the head short detector.

The differential signal F and C from the threshold detector 36 is applied to the bases of transistors 82 and 84 of the rectifier illustrated in FIG. 5. The transistors 82 and 84, which have their emitters and collectors connected, form a rectifying junction. The common emitter circuit of transistors 82 and 84 are connected to the input of a transistor 86 which supplies a rectified signal D that is a reproduction of the highest amplitude signal of the inputs F and C. Current sources 88 and 90 provide the necessary current bias.

Figure 6:
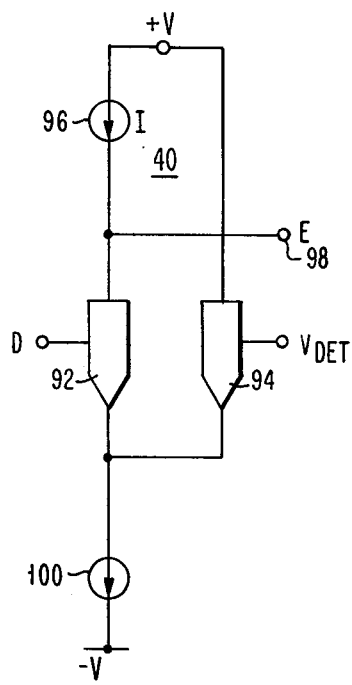
FIG. 6 is a schematic circuit diagram of the level detector employed in the head short detector.

The level detector of FIG. 6 includes a pair of emitter coupled transistors 92 and 94, and current sources 96 and 100. The rectified signal D from the rectifier 38 is fed to transistor 92, and the level detector senses whether the signal D is higher or lower than a predetermined detection level voltage $V_{DET}$.

If the signal D is higher than $V_{DET}$, then transistor 92 conducts with a collector current of magnitude 2I, equal to twice the current I through current source 96, and as a result a current signal E of magnitude I is drawn from terminal 98 towards the current source 96. However, if the signal D is lower than $V_{DET}$, the transistor 92 cuts off, and transistor 94 conducts so that a current of magnitude I flows to the terminal 98 from current source 96.

Figure 7:
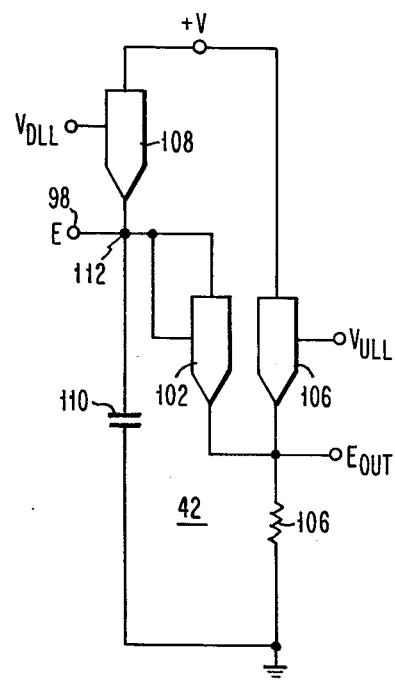
FIG. 7 is a schematic circuit diagram of the integrator employed in the head short detector.

The signal E at terminal 98 appears at the input of the integrator 42, depicted in FIG. 7. The integrator circuit consists of emitter coupled transistors 102 and 104 having a resistor 106 connected between the emitter circuit and ground potential. A clamp transistor 108 has its emitter electrode connected to the base-collector circuit of transistor 102, and to the input terminal 98, as well as to a capacitor 110 that integrates the input current.

When the signal D in FIG. 6 is higher than $V_{DET}$, the voltage at terminal 98 ramps down until limited by transistor 108. If the signal D is lower than $V_{DET}$, the voltage at terminal 98 ramps up until limited by transistor 104. Transistor 108 which serves as a down level clamp prevents saturation in the negative direction, whereas transistor 104 which serves as an up level clamp prevents saturation in the positive direction. Transistor 102 adjusts the level of the signal when the up level clamp transistor 104 is on and operative. By means of this circuit, the voltage at the junction 112 remains at a level between the clamp voltages $V_{DLL}$ and $V_{ULL}$, the upper limit and lower limit clamp voltages.

The level of the integrated output signal E provides an indication of whether the selected magnetic head operating in the write mode is functioning normally or is a shorted head.

If a short or fault is present in the recording channel, the DC level of the signal (FIG. 8) disappears, but the spikes remain. In such case the voltage A', B' is below the threshold voltage most of the time, and differential signal F and C, and signal D remain at a low level. In such case, current is forced into terminal 98, and the voltage across the integrating capacitor 110 ramps in the positive direction until the upper limit clamp (ULL) prevents further positive excursion. In this condition, an error is shown to exist.

There has been disclosed a dual mode preamplifier that is useful for conventional read preamplifier functions, and for monitoring the write channel and write heads during the write mode, in a simple and inexpensive manner, without the need of additional complex circuitry. The head short detector may be used to detect the absence of write current transitions. The absence of transitions would be interpreted as a head short by the threshold detector portion of the head short detecting circuit.

Having thus described my invention, what I claim as new, and desire to secure by Letters Patent is:

1. A dual mode read preamplifier for use in a data recording system comprising;
   a plurality of recording channels for operating during read and write modes;

a monitor channel including first resistance means connected to each of said recording channels for operation during the write mode;

first selection means for energizing any one of said recording channels for transducing operation;

write driver and second selection means for supplying a write signal to a selected recording channel; and second resistance means coupled to the inputs of said recording channels and connected to said first resistance means for attenuating said write signal, and for providing isolation between a selected energized recording channel and the others of said recording channels.

2. A dual mode read preamplifier as in claim 1 wherein said recording channels include at least one non-center-tapped recording head.

3. A dual mode read preamplifier as in claim 2, including a head short detector coupled to the output circuit of each of said channels.

4. A dual mode read preamplifier as in claim 3, wherein the write signal sensed by said head short detector is a balanced differential signal.

5. A dual mode read preamplifier as in claim 4, wherein said head short detector comprises a threshold detector for determining whether said differential signal is greater than a specified threshold voltage.

6. A dual mode read preamplifier as in claim 5, wherein said head short detector including said threshold detector senses the absence of write current transitions.

7. A dual mode read preamplifier as in claim 5, wherein said head short detector comprises a level detector for sensing the level of the processed write signal relative to a reference voltage.

8. A dual mode read preamplifier as in claim 7, wherein said head short detector comprises an integrator for integrating the currents supplied by said level detector and for providing a clamping function to prevent saturation.

9. A dual mode read preamplifier as in claim 1, wherein the value of said second resistance means is a high multiple of at least one hundred times of that of said first resistance means.

* * * * *